(12) United States Patent
Lee et al.

(10) Patent No.: US 12,100,931 B2
(45) Date of Patent: *Sep. 24, 2024

(54) BEAM PROJECTOR MODULE FOR PERFORMING EYE-SAFETY FUNCTION USING TEMPERATURE, AND CONTROL METHOD THEREOF

(71) Applicant: Namuga Co., Ltd., Gyeonggi-do (KR)

(72) Inventors: Jun Youb Lee, Gyeonggi-do (KR); Young Gyu Kang, Gyeonggi-do (KR); Jeong Hwa Seo, Gyeonggi-do (KR)

(73) Assignee: Namuga Co., Ltd., Gyeonggi-do (KR)

( * ) Notice: Subject to any disclaimer, the term of this patent is extended or adjusted under 35 U.S.C. 154(b) by 551 days.

This patent is subject to a terminal disclaimer.

(21) Appl. No.: 17/337,982

(22) Filed: Jun. 3, 2021

(65) Prior Publication Data

US 2021/0288467 A1   Sep. 16, 2021

Related U.S. Application Data

(63) Continuation of application No. 16/460,040, filed on Jul. 2, 2019, now Pat. No. 11,056,855.

(51) Int. Cl.
*H01S 5/068* (2006.01)
*H01S 5/02257* (2021.01)
(Continued)

(52) U.S. Cl.
CPC ...... *H01S 5/06825* (2013.01); *H01S 5/02257* (2021.01); *H01S 5/02469* (2013.01); *H01S 5/06804* (2013.01); *H01S 5/183* (2013.01)

(58) Field of Classification Search
CPC .... H01S 5/0225; H01S 5/02257; H01S 5/024; H01S 5/02461; H01S 5/02469; H01S 5/06804; H01S 5/06825; H01S 5/02208–02212; H01S 5/0014; H01S 5/0021; H01S 5/0087; H01S 5/06–0687; F21S 41/176; F21S 41/16
See application file for complete search history.

(56) References Cited

U.S. PATENT DOCUMENTS 11,056,855 B2 * 7/2021 Lee ................. H01S 5/02469
2006/0022213 A1 * 2/2006 Posamentier ....... H05K 1/0212
257/99

(Continued)

FOREIGN PATENT DOCUMENTS

DE    102015209013 A1 * 12/2016

*Primary Examiner* — Sean P Hagan
(74) *Attorney, Agent, or Firm* — FisherBroyles, LLP; Susan M. Oiler

(57) ABSTRACT

An embodiment provides a beam projector module that includes: a light source configured to output light; a substrate configured to support the light source; an optical device configured to reduce the light in terms of intensity output to a predetermined space; a frame configured to space the optical device apart from the light source by a predetermined distance, the frame forming a closed space with the substrate and the optical device; a temperature sensor configured to measure a temperature of the frame; and a processor configured to control an output of the light source. The processor is configured to operate the light source in an eye-safety mode when a temperature drop rate of the frame exceeds a reference value.

13 Claims, 14 Drawing Sheets

(51) Int. Cl.
*H01S 5/024* (2006.01)
*H01S 5/183* (2006.01)

(56) References Cited

U.S. PATENT DOCUMENTS

| | | | |
|---|---|---|---|
| 2016/0290620 A1* | 10/2016 | Ichikawa | H01S 5/02407 |
| 2017/0138559 A1* | 5/2017 | Hartisch | F21S 41/16 |
| 2017/0240094 A1* | 8/2017 | Künecke | F21S 45/70 |
| 2017/0322154 A1* | 11/2017 | Hoehmann | G01N 21/95 |
| 2017/0353004 A1* | 12/2017 | Chen | H01S 5/02234 |
| 2018/0172220 A1* | 6/2018 | Muster | F21V 9/40 |
| 2019/0131767 A1 | 5/2019 | Lee et al. | |
| 2019/0229495 A1* | 7/2019 | Pierer | G02B 27/01 |

* cited by examiner

BEAM PROJECTOR MODULE FOR PERFORMING EYE-SAFETY FUNCTION USING TEMPERATURE, AND CONTROL METHOD THEREOF

CROSS REFERENCE TO RELATED APPLICATION

This application is a continuation of U.S. Ser. No. 16/460,040, filed Jul. 2, 2019, which claims priority to the foreign patent applications, Korean Patent Application No. 10-2018-0077697, filed Jul. 4, 2018 and Korean Patent Application No. 10-2019-0079205, filed Jul. 2, 2019, which are both hereby incorporated by reference for all purposes as if fully set forth herein.

BACKGROUND OF THE INVENTION

Field of the Invention

The present disclosure relates to a beam projector module.

Description of the Prior Art

LASER is an acronym for "Light Amplification by Stimulated Emission of Radiation". Lasers are capable of outputting light in an intensive and condensed manner. In addition, lasers may have a monochromaticity and directivity, and due to this characteristic, lasers are widely utilized in the field of optical sensor technology.

For example, a laser may be utilized as a light source of a distance-measuring device, and may be utilized as a light source of a 3D depth camera. A Time of Flight (ToF) type distance-measuring device is capable of measuring the traveling distance of pulsed light waves output from a light source and returned by being reflected by an object using a phase difference, and measuring a distance using the phase difference and frequency information. A Structure Light (SL) or a hybrid stereo type distance-measuring device is capable of extracting distance information by forming a regular or irregular pattern through a diffuser using a laser light source as a source.

Due to the high output and directivity thereof, lasers are used as sources of distance measurement and 3D depth cameras.

Meanwhile, the high output characteristic of lasers may be recognized as an advantage in view of the fact that it is possible to increase the flying distance of light and to maintain the output of the returned light higher than a certain level, but may be recognized as a disadvantage in view of safety. When high-power light is directly radiated to a person's eye, it may damage the eye and, in extreme cases, may cause blindness. Accordingly, when using a laser as a light source, it is always necessary to consider a safety problem.

In general, each country has an eye-safety standard requiring that the intensity of light output from a device be adjusted to be a reference value or less.

One of the methods of adjusting the intensity of output light is to place a diffuser capable of reducing the intensity of light on the output path of the light. Since the diffuser disperses the concentrated light to a predetermined field of view (FOV) required by the system by the effects of refraction and diffraction using the property of light, the intensity of light passing through the diffuser is reduced per unit area.

However, in a device for adjusting the intensity of light using the diffuser as described above, when the diffuser is detached, high-output light is output as it is, which may cause a safety problem.

SUMMARY OF THE INVENTION

In this context, the embodiments disclosed herein provide a technique for a beam projector module that provides an eye-safety function.

In view of the foregoing, an embodiment provides a beam projector module that includes: a light source configured to output light; a substrate configured to support the light source; an optical device configured to reduce the light in terms of intensity output to a predetermined space; a frame configured to space the optical device apart from the light source by a predetermined distance, the frame forming a closed inner space with the substrate and the optical device; a temperature sensor configured to measure a temperature of the beam projector module; and a processor configured to control an output of the light source. The processor is configured to operate the light source in an eye-safety mode when a temperature drop rate of the beam project module exceeds a reference value.

In the beam projector module, the temperature sensor may be connected to the frame to measure a temperature of the frame, and the processor may be configured to operate the light source in the eye-safety mode when a temperature drop rate of the frame exceeds a reference value.

In the beam projector module, the temperature sensor may be connected to the optical device to measure a temperature of the optical device, and the processor may be configured to operate the light source in the eye-safety mode when a temperature drop rate of the optical device exceeds a reference value.

In the beam projector module, the beam projector module may include two or more temperature sensors, one of the two or more temperature sensors is connected to the frame to measure a temperature of the frame, another one of the two or more temperature sensors is connected to the optical device to measure a temperature of the optical device, and the processor may be configured to operate the light source in the eye-safety mode when temperatures of the frame and the optical device exceed a reference value.

In the beam projector module, the processor may be configured to: compare a temperature drop rate of the frame with a temperature drop rate of the optical device to extract crack position information, and operate the light source in the eye-safety mode when it is determined that a crack is generated in the optical device based on the crack position information.

In the beam projector module, the light source may include a vertical cavity surface-emitting laser (VCSEL), and the optical device may include a diffuser configured to disperse the light.

In the beam projector module, the processor may be configured to transmit temperature data of the beam projector module to a light reception device, and the light reception device may be configured to compensate for a temperature characteristic of the light obtained by the optical device using the temperature.

In an embodiment provides a method of controlling a beam projector module including a light source and an optical device configured to reduce intensity of light output from the light source. The method includes: measuring, by a temperature sensor, a temperature of the beam projector module; and operating, by a processor, the light source in an eye-safety mode when a temperature drop rate of the beam project module exceeds a reference value.

In the control method, the temperature sensor may be configured to measure a temperature of the frame that supports the optical device, and the processor may be configured to operate the light source in the eye-safety mode when a temperature drop rate of the frame exceeds a reference value.

In the control method, the temperature sensor may be configured to measure a temperature of the optical device, and the processor may be configured to operate the light source in the eye-safety mode when a temperature drop rate of the optical device exceeds a reference value.

In the control method, the temperature sensor may be configured to measure a temperature of an inner space surrounded by the frame that supports the optical device, and the processor may be configured to operate the light source in the eye-safety mode when a temperature drop rate of the inner space exceeds a reference value.

In the control method, the temperature sensor may be configured to measure a temperature of the optical device and a temperature of the frame that supports the optical device, and the processor may be configured to: extract crack position information by comparing temperature drop rates of the optical device and the frame when the temperature drop rates of the optical device and the frame exceeds a reference value, and operate the light source in the eye-safety mode when a crack is generated in the optical device.

In the control method, the reference value may be calculated depending on an external temperature measured by an external temperature sensor that communicates with the processor outside the beam projector module.

The control method may further include estimating a temperature of the optical device using a temperature of the frame.

The control method may further include: transmitting the temperature of the optical device to the light reception device; acquiring, by the light reception device, an optical value of the optical device using the temperature of the optical device; and compensating, by the light reception device, for a light reception value depending on the optical value.

As described above, according to the embodiments disclosed herein, it is possible to safely protect a user's eyes even if an abnormality occurs in the beam projector module.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

Figure 1:
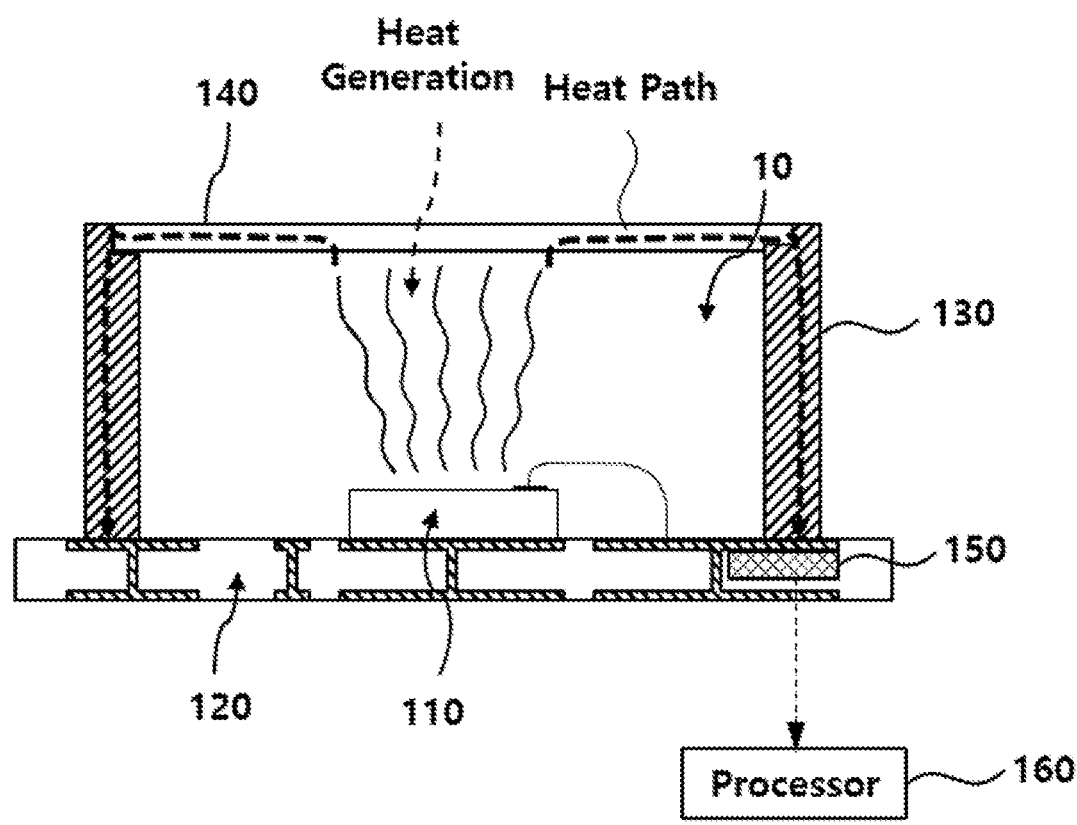
FIG. 1 is a view illustrating a beam projector module according to a first embodiment, which is normally operating.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a view illustrating a beam projector module according to a first embodiment, which is normally operating.

Referring to FIG. 1, a beam projector module 100 may include a light source 110, a substrate 120, a frame 130, an optical device 140, a temperature sensor 150, a processor 160, and the like.

Wiring lines may be patterned on the substrate 120. The substrate 120 may receive power from the outside, and the power may be supplied to the light source 110, the temperature sensor 150, the processor 160, and the like through respective wiring lines. The substrate 120 may be formed of a material having a low thermal resistance or a thermally conductive material.

The light source 110 may be disposed on the substrate 120, the anode electrode of the light source 110 may be connected to the anode wiring line of the substrate 120, and the cathode electrode may be connected to the cathode wiring line of the substrate 120. The light source 110 may be disposed by being connected to the substrate 120 in a wire bonding manner. Alternatively, the light source 110 may be disposed on the substrate 120 through flip chip bonding without a wire. In the case where the light source 110 is connected to the substrate 120 through flip chip bonding, it is possible to configure a smaller-sized beam projector module because there is no wire line.

The light source 110 may output light toward the optical device 140. A single light source 110 may be disposed, or two or more light sources 110 may be disposed. The light source 110 may be a light source that outputs light of a single wavelength range, or may be a light source 110 having a separately configured portion so as to output light having multiple wavelength regions. The light source 110 may include a vertical cavity surface-emitting laser (VCSEL).

Power supply to the light source 110 may be controlled by the processor 160. The processor 160 may control the power supplied to the light source 110 differently between a normal mode and an eye-safety mode.

For example, the processor 160 may supply power to the light source 110 only in the normal mode, and may not supply power to the light source 110 in the eye-safety mode. Alternatively, the processor 160 may lower the level of power supplied to the light source 110 in the eye-safety mode than in the normal mode. Accordingly, the intensity of light output from the light source 110 may be reduced.

The optical device 140 may be disposed at a certain distance from the light source 110 via the frame 130. The optical device 140 may reduce the intensity of light output to a predetermined space with respect to the light output from the light source 110.

The optical device 140 may include a diffuser. The diffuser may reduce the intensity of light output from the light source 110 to a predetermined space by dispersing the light output from the light source 110.

The frame 130 may be supported by the substrate 120. In addition, the frame 130 may support the optical device 140.

An inner space 10 may be formed by being sealed by the substrate 120, the frame 130, and the optical device 140. The air formed in the closed inner space 10 may not flow out to the outside or may circulate to/from the outside at a very slight level. Convection may occur inside the substantially closed inner space 10, but heat exchange with the outside is only possible through the substrate 120, the frame 130, and the optical device 140 that form the closed inner space 10.

The frame 130 may be made of a material having a low thermal resistance or a conductive material. The frame 130 may be in contact with the optical device 140 on one side and the substrate 120 on the other side. With this configuration, the frame 130 may function as a heat path for discharging the heat formed in the optical device 140 toward the substrate 120.

The light source 110 is a device for converting electricity into light, and electric energy of a certain level or more may be emitted as heat according to conversion efficiency. The heat emitted from the light source 110 may be mainly transmitted to the optical device 140 located on the upper side. The temperature of the optical device 140 may be raised by the heat of the light source 110. In addition, the heat of the optical device 140 may flow to the substrate 120 along the frame 130 having a low thermal resistance.

A temperature sensor 150 capable of measuring the temperature of the frame 130 may be disposed inside the substrate 120 or on the substrate 120.

The temperature sensor 150 may be connected to the frame 130 so as to measure the temperature of the frame 130.

The heat emitted from the light source 110 is transferred to the optical device 140, the heat of the optical device 140 is transferred through the frame 130, and the heat transferred to the frame 130 may be measured as the temperature of the frame 130 by the temperature sensor 150. The temperature value of the frame measured by the temperature sensor 150 may be transmitted to the processor 160.

In another embodiment, the temperature sensor 150 may be disposed inside the substrate 120 or the frame 130 so as to measure the temperature of the closed inner space 10. Thus, the processor 160 may obtain the temperature value of the closed inner space 10.

Figure 2:
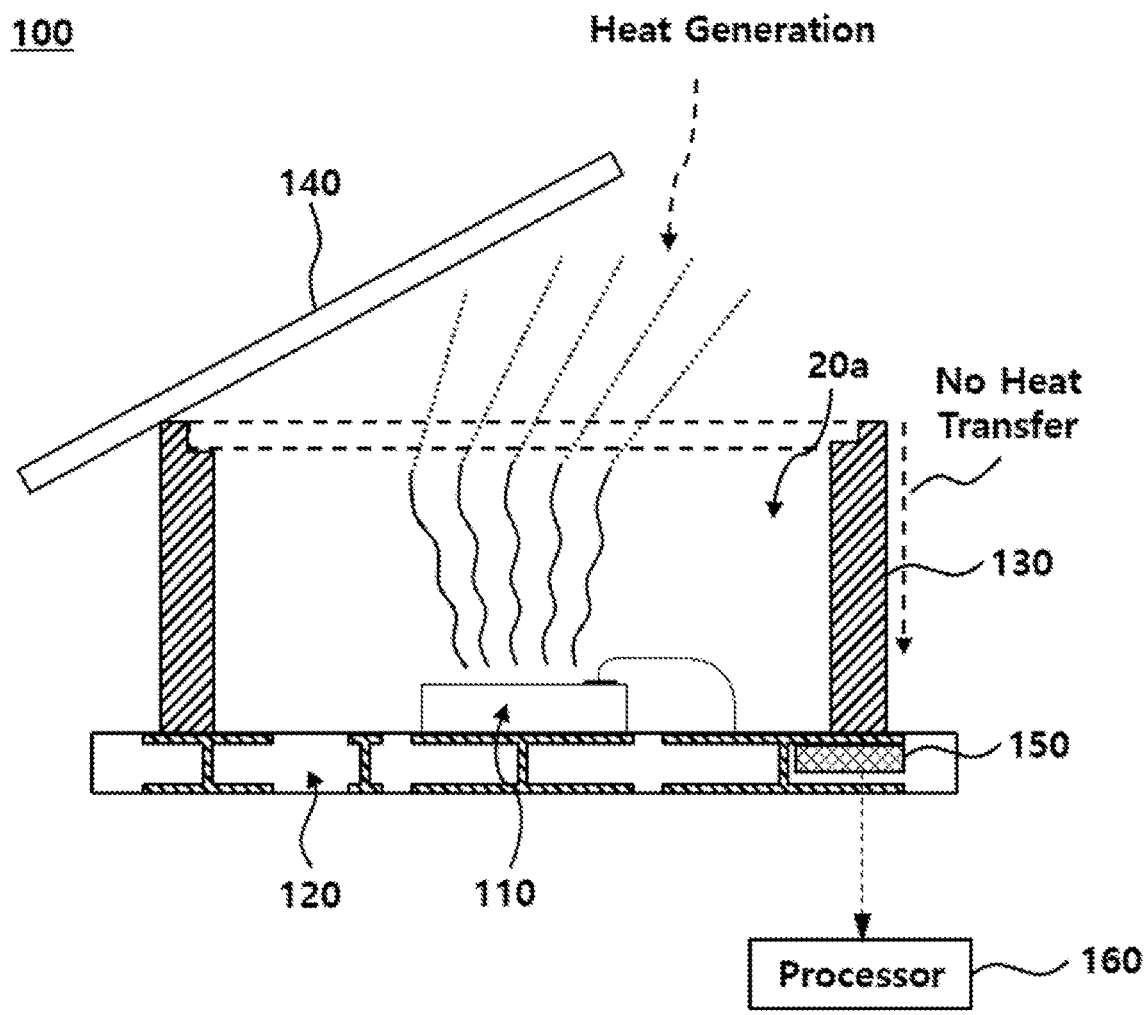
FIG. 2 is a first view illustrating the beam projector module according to the first embodiment, which is abnormally operating.

FIG. 2 is a first view illustrating the beam projector module according to the first embodiment, which is abnormally operating.

Referring to FIG. 2, the optical device 140 may be detached from the frame 130 for any reason. When the optical device 140 is detached from the frame 130, the closed inner space 10 in normal operation may be changed into an opened inner space 20a.

In addition, the heat emitted from the light source 110 may flow to the outside through the opened inner space 20a. In the case of the closed inner space, the heat trapped therein can be discharged to the outside only through the outer wall, the substrate 120, the frame 130, and the optical device 140 that form the closed space, but in the case of the opened inner space 20a, the heat therein can be easily released to the outside through convection.

Thus, when the optical device 140 is detached from the frame 130, the temperature of the inner space is lowered. In addition, a large amount of heat transferred from the enclosed inner space to the optical device 140 is reduced in the opened inner space. In addition, the amount of heat transferred to the frame 130 is reduced, and the temperature of the frame 130 is also lowered. The reduced temperature of the frame 130 may be measured by the temperature sensor 150, and the temperature value measured by the temperature sensor 150 may be measured to be lower than that measured when the beam projector 100 operates normally.

The processor 160 may detect the temperature change of the frame 130, and may determine whether or not the optical device 140 is detached.

When the optical device 140 is detached, intensive light emitted from the light source may directly reach the eyes of the user without being dispersed, which may cause a safety problem.

Thus, the processor 160 may determine whether or not the optical device 140 is detached through the temperature change of the frame 130, and when it is determined that the optical device 140 is detached, the processor 160 may operate the light source 110 in the eye-safety mode.

The processor 160 may stop power supply to the light source 110 in the eye-safety mode. Accordingly, when the optical device 140 is detached, the operation of the light source 110 may be stopped by the processor 160 so as to safely protect the user's eyes.

In addition, in the eye-safety mode, the processor 160 may lower the power supply level to the light source 110 than that during the normal operation. For example, the current flowing to the light source 110 may be reduced. Accordingly, when the optical device 140 is detached, the intensity of the light output from the light source 110 may be reduced by the processor 160 so as to safely protect the user's eyes.

Meanwhile, when the temperature sensor 150 measures the temperature of the closed inner space 10, the optical device 140 is detached so that the inner space is opened, and the heat of the opened inner space 20a is released to the outside. Thus, the temperature of the space 20a can be lowered. The processor 160 may obtain the temperature drop rate of the inner space 20a through the temperature sensor 150.

Figure 3:
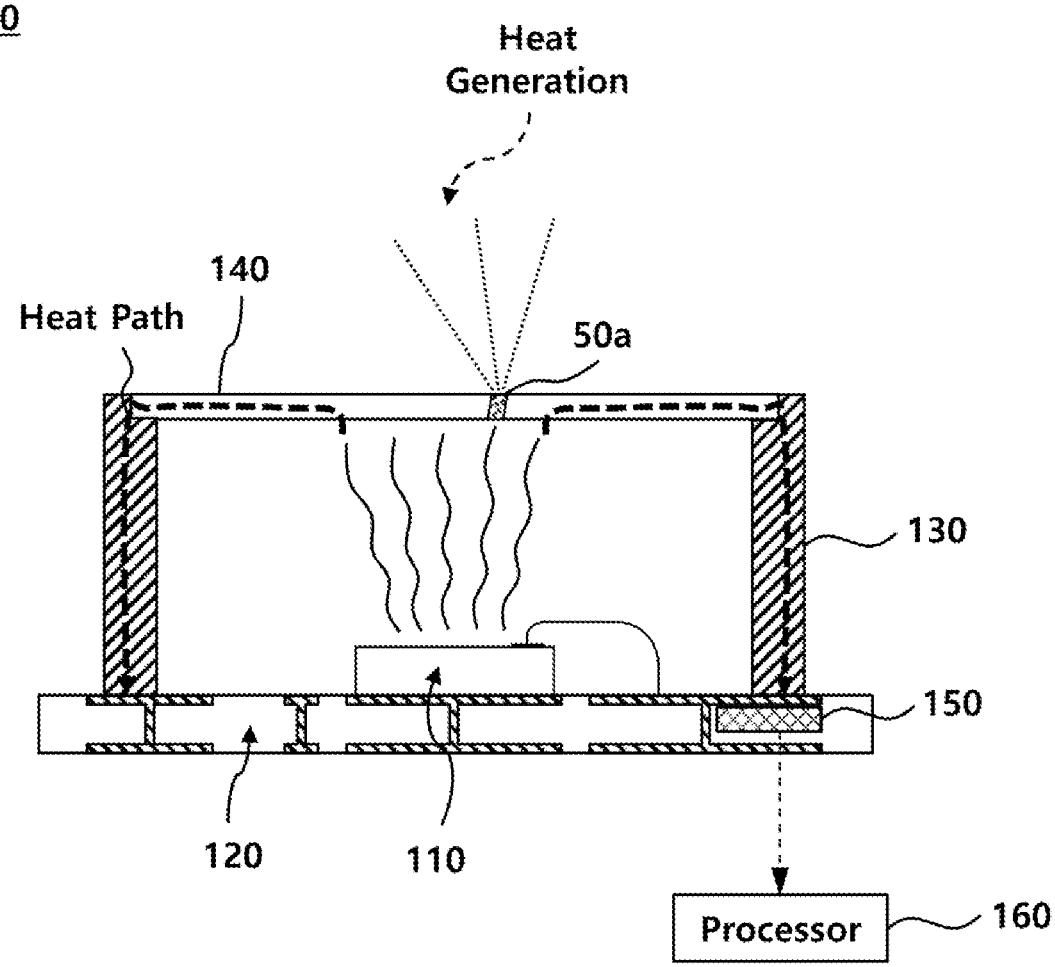
FIG. 3 is a second view illustrating a beam projector module according to the first embodiment, which is abnormally operating.

FIG. 3 is a second view illustrating a beam projector module according to the first embodiment, which is abnormally operating.

Figure 4:
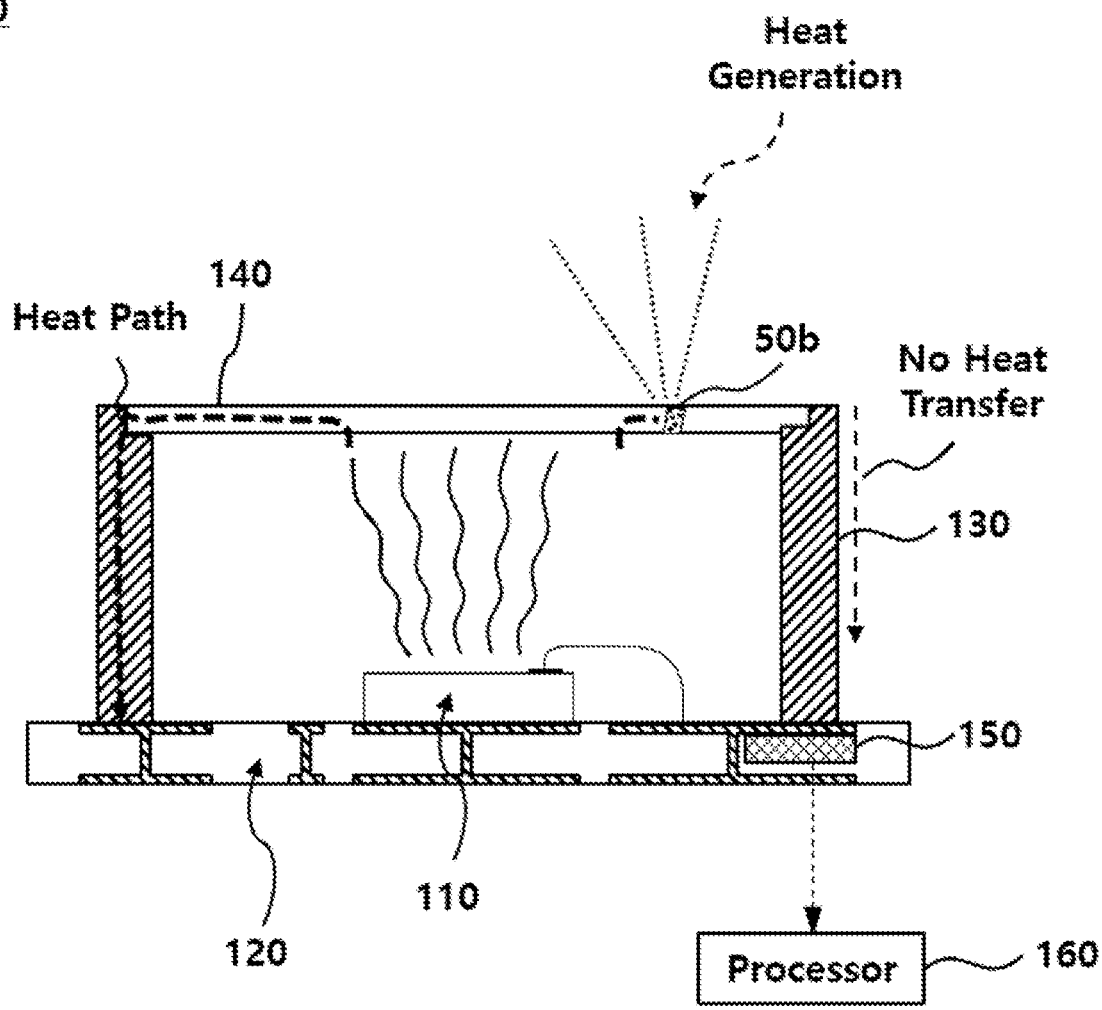
FIG. 4 is a third view illustrating the beam projector module according to the first embodiment, which is abnormally operating.

FIG. 4 is a third view illustrating the beam projector module according to the first embodiment, which is abnormally operating.

Referring to FIGS. 3 to 4, cracks 50a and 50b may be generated in a portion of the optical device 140 for any reason.

When a crack 50a is generated in the central portion of the optical device 140 as illustrated in FIG. 3, the heat emitted from the light source 110 may be transferred to the optical device 140, and the heat of the optical device 140 may be transferred to the frame 130 through the heat path in which the crack 50a is not generated.

However, external air having a relatively low temperature may flow through the portion in which the crack 50a is generated, and heat may be radiated to the outside of the beam projector 100. That is, the closed inner space may be opened by the crack 50a on the optical device.

Therefore, the temperature of the frame 130 may become relatively lower than that in the case in which the crack 50a is not generated in the optical device 140.

When the crack 50b is generated close to the connecting portion between the optical device 140 and the frame 130 as in FIG. 4, the heat path is blocked, and thus heat emitted from the light source 110 may be difficult to be transferred through the optical device 140 to the frame 130.

In this case, however, heat may be radiated to the outside of the beam projector 100 through the crack 50b, and the temperature of the frame 130 may be lowered due to the external air introduced through the clearance of the crack 50b. Therefore, even when the crack 50b is generated in the connecting portion between the optical device 140 and the frame 130, the temperature of the frame 130 may become relatively lower than that in the normal case.

When the cracks 50a and 50b are generated, the temperature sensor 150 may transmit the relatively low measured temperature value to the processor 160, and the processor 160 may operate the eye-safety mode so as to reduce the power transmitted to the light source 110, may stop power supply so as to lower the intensity of the light emitted from the light source 110, or may prevent light from being emitted, so that the user's eyes can be protected when the cracks 50a and 50b are generated.

Accordingly, when the cracks 50a and 50b are generated in a portion of the optical device 140, it may be possible to perform eye-safety mode operation through temperature measurement, and it may be possible to safely protect the user's eyes.

Meanwhile, even when the temperature sensor 150 measures the temperature of the closed space 10, the temperature of the closed space 10 may be lowered due to the generation of cracks. At this time, the processor 160 may acquire a temperature drop rate through the temperature sensor 150, and may drive the light source 110 in the eye-safety mode.

Figure 5:
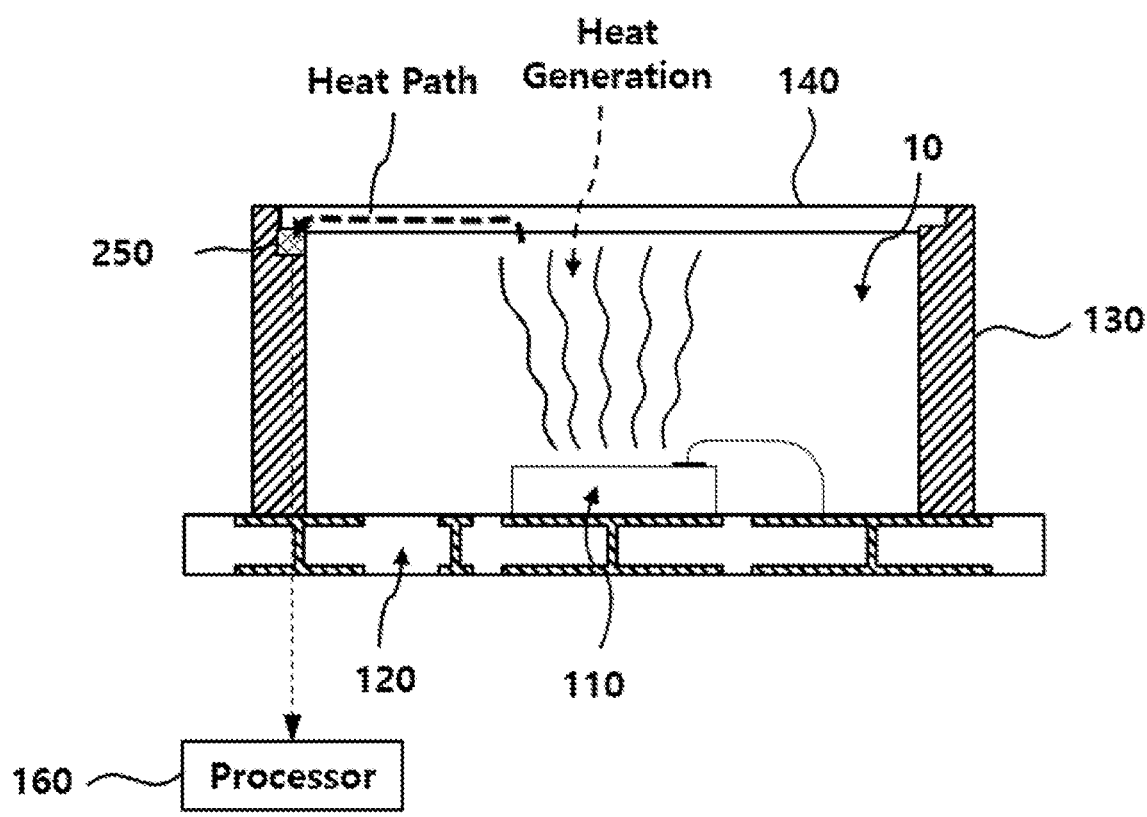
FIG. 5 is a view illustrating the beam projector module according to a second embodiment, which is normally operating.

FIG. 5 is a view illustrating the beam projector module according to a second embodiment, which is normally operating.

Referring to FIG. 5, a beam projector module 200 may include a light source 110, a substrate 120, a frame 130, an optical device 140, a temperature sensor 250, and a processor 160. In addition, the temperature sensor 250 may be disposed on a portion of the upper part of the frame 130 and may be arranged to be connected to the optical device 140.

Meanwhile, the wiring lines connecting the temperature sensor 250 and the substrate 120 may be connected through the inside of the frame 130 or through the surface of the frame 130.

When the temperature sensor 250 is disposed to be in contact with the optical device 140, since it is possible to measure the temperature of the direct optical device 140 directly, rather than through the heat transferred through the frame 130, it may be possible to correctly measure the temperature of the optical device 140.

For example, when defects are generated on both of the frame 130 and the optical device 140 for any reason, it may be difficult for the heat emitted from the light source 110 to reach the substrate 120 because the heat path is blocked due to the defect on the frame 130. However, in the case in which the temperature sensor 250 is directly attached to the optical device 140, it is possible to correctly measure the temperature change of the optical device 140 despite the defect of the frame 130.

In addition, when the temperature sensor 250 is disposed to be connected to the optical device 140, the heat path through which the heat emitted from the light source 110 is transferred to the temperature sensor 250 may be shortened. Accordingly, the processor 160 may more sensitively measure the temperature drop rate than that in the case in which the heat is transferred through the frame 130.

In addition, the beam projector module 200 may include an additional seal material in order to maintain a closed space between the temperature sensor 250 and the optical device 140. The seal member may be thermally conductive or low in heat resistance, and may transfer the heat of the optical device 140 to the temperature sensor.

The processor 160 may calculate a temperature drop rate depending on the temperature change of the optical device 140 measured through the temperature sensor 250, and may compare the measured temperature drop rate with a reference value so as to drive the light source 110 in the eye-safety mode.

Figure 6:
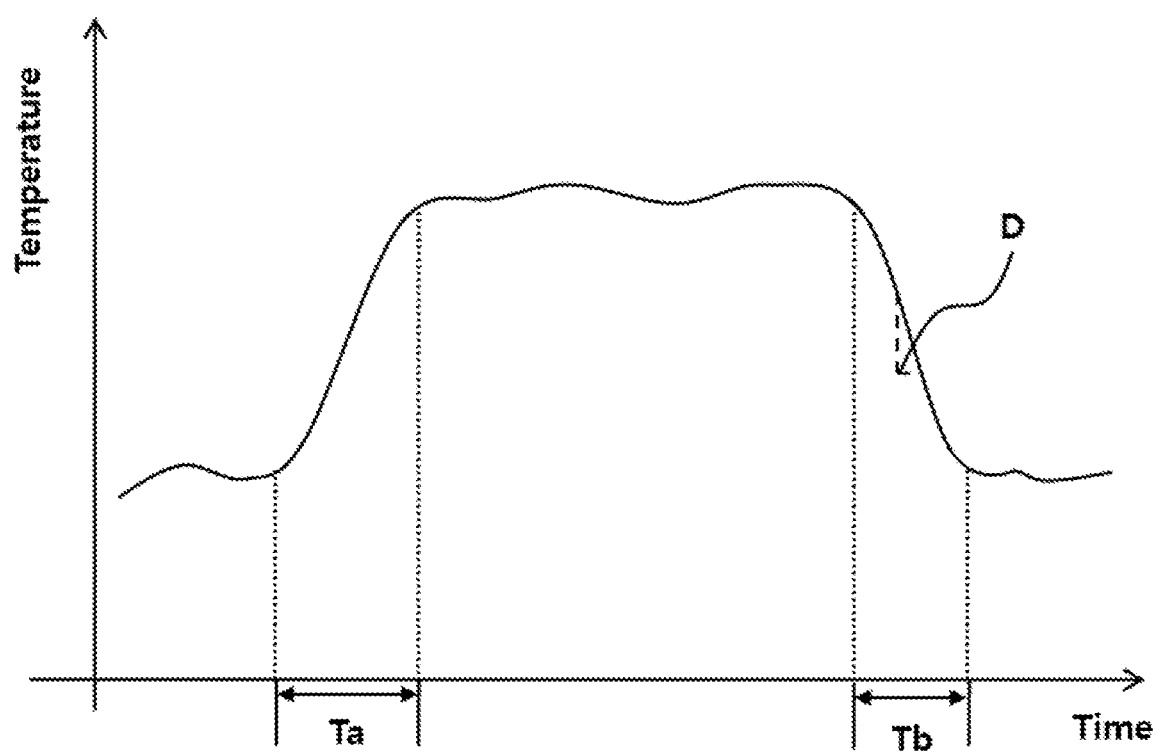
FIG. 6 is an exemplary graph representing a temperature change with a time change of a beam projector module according to embodiments disclosed herein.

FIG. 6 is an exemplary graph representing a temperature change according to a time change of the beam projector module according to the first embodiment or the second embodiment.

Referring to FIGS. 1 to 5 and 6, when the beam projector module is started, the temperature of the optical device 140 rises due to the heat generation from the light source 110 in the initial operation period Ta, and the temperature of the frame 130 positioned in the path of the heat emitted from the optical device 140 may rise. In addition, the temperature of the closed inner space 10 may also rise.

The temperature of the beam projector module 100 or 200 or the temperature of each of the optical device 140, the frame 130, and the closed inner space 10 may increase to a predetermined level, and may then be maintained at a predetermined value while maintaining a thermal equilibrium state with the outside.

Meanwhile, when the optical device 140 forming the closed space in the beam projector module 100 or 200 is detached from the frame 130, the temperature of each of the optical device 140, the frame 130, and the closed space 10 may be sharply lowered with a crack generation section Tb in which the temperature of each of the beam projector module 100 or 200, the frame 130, and the optical device 140 is lowered.

In addition, the temperatures of the optical device 140, the frame 130, and the internal space 10 may be lowered even when a crack is generated in a part of the optical device 140 and thus the closed inner space is opened.

The processor 160 may have a reference value for the temperature drop rate D of the beam projector module 100 or 200, the frame 130, the optical device 140, and the inner space.

The reference value may be calculated in advance in consideration of the materials of the frame 130, the optical device 140, the substrate 120, or the external environment of the mobile terminal in which the beam projector module 100 or 200 is installed. For example, when the frame 130 and the optical device 140 are formed of a material having high thermal conductivity, the reference value may be large. On the contrary, when the frame 130 and the optical device 140 are formed of a material having low thermal conductivity, the reference value may be small.

The processor 160 may calculate the temperature drop rate D based on the temperature values measured by the temperature sensor 150 or 250 and may compare the calculated temperature drop rate D with the reference value.

The beam projector module 100 or 200 may compare the temperature drop rate D of the optical device 140, the frame 130, and the internal space 10 with the reference value to determine whether or not the optical device 140 is detached, and whether or not a crack is generated on the optical device 140.

When the temperature drop rate of the beam projector module 100 or 200, the frame 130, the optical device 140, and the inner space exceeds the reference value, the processor 160 may drive the light source 110 in an eye-safety mode, and may stop the power supply to the light source 110 or may reduce the amount of power such that the light source 110 does not output light or the intensity of light output from the light source 110 is reduced.

Figure 7:
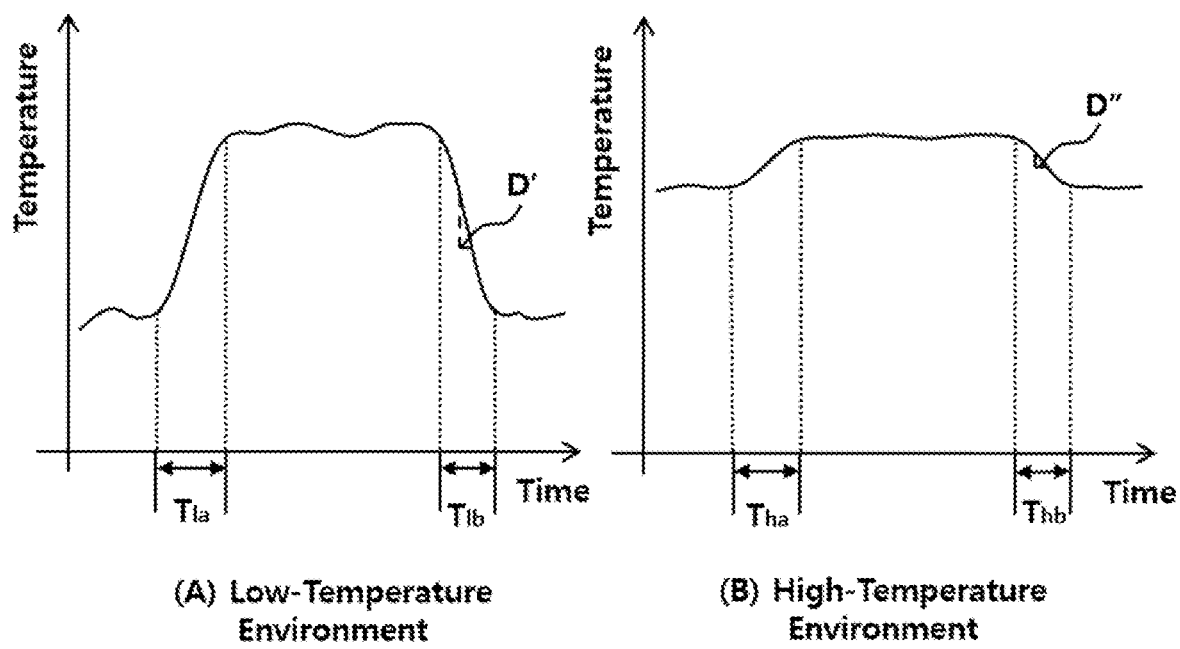
FIG. 7 is an exemplary graph representing a temperature change in each external environment of the beam projector module according to the first embodiment or the second embodiment.

FIG. 7 is an exemplary graph representing a temperature change in each external environment of the beam projector module according to the first embodiment or the second embodiment.

Referring to FIG. 7, the reference value of the temperature drop rate may vary depending on the external environment in which the beam projector module 100 or 200 is installed.

The beam projector module 100 or 200 may include an external temperature sensor disposed on the outside thereof so as to measure the temperature outside the beam projector module 100 or 200. The external temperature sensor may measure the temperature outside the beam projector module 100 or 200, and based on this, the processor 160 may differently calculate the reference value of the temperature drop rate in consideration of the external environment.

For example, (A) when the beam projector module is driven in a low temperature environment, the temperature rise rate in the initial heating section Tla may be higher than the temperature rise rate in the initial heating section Tha in the high temperature environment (B). In addition, the temperature drop rate D' in the crack generation section Tlb in the low temperature environment may be higher than the temperature drop rate D" in the crack generation section Thb in the high temperature environment.

Therefore, the processor 160 may calculate the reference value of the temperature drop rate in each environment in consideration of the external temperature measured through the external temperature sensor, and may determine whether or not a crack is generated by comparing the temperature drop rate with the reference value calculated according to the situation.

Figure 8:
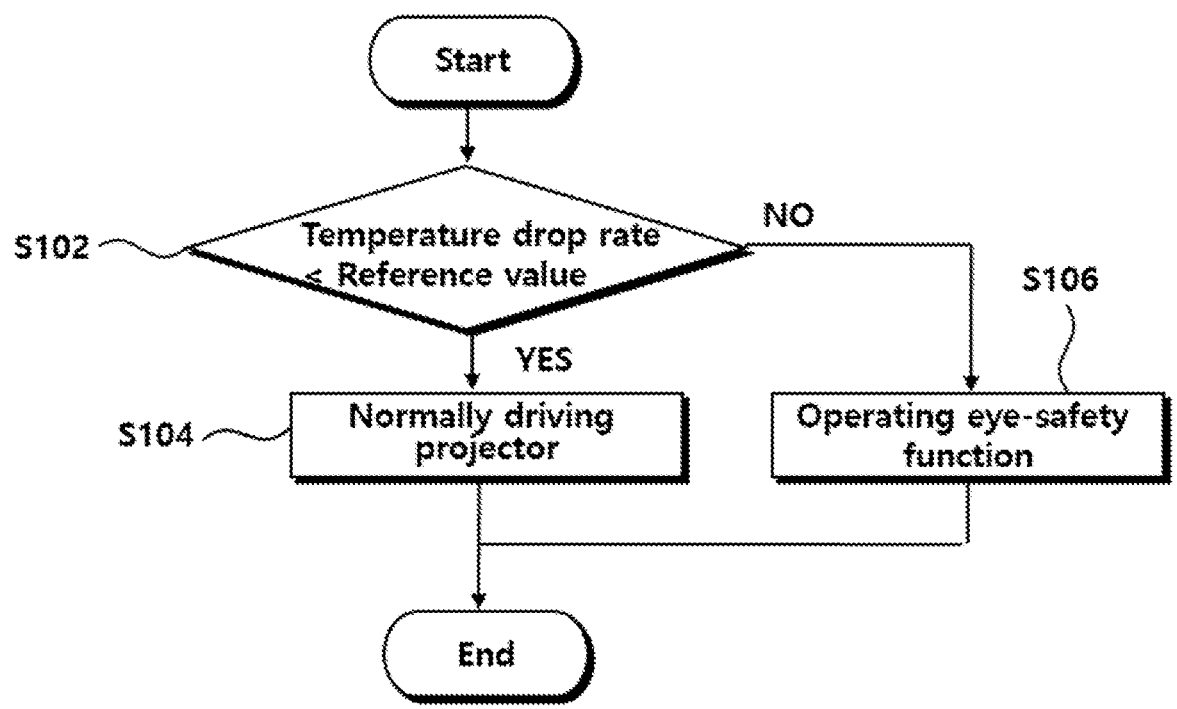
FIG. 8 is a flowchart of a method of operating the eye-safety function of the beam projector module according to the first embodiment or the second embodiment.

FIG. 8 is a flowchart of a method of operating the eye-safety function of the beam projector module according to the first embodiment or the second embodiment.

Referring to FIGS. 1 to 8, the temperature sensor 150 or 250 measures the temperature of each of the frame 130 supporting the optical device 140, the optical device 140, and the inner space (S102), and the processor 160 may determine whether the temperature drop rate is higher or lower than the reference value by comparing the drop rate of the temperature measured by the temperature sensor with a reference value calculated in advance.

At this time, the reference value may be appropriately calculated through the relation with the external temperature using the external temperature sensor.

In addition, when the temperature drop rate of the frame 130, the optical device 140, and the inner space does not exceed the reference value, the processor 160 may operate the light source 110 in the normal mode (S104).

Meanwhile, when the temperature drop rate of the frame 130, the optical device 140, and the internal space exceeds the reference value, the processor 160 may operate the light source 110 in the eye-safety mode (S106).

Figure 9:
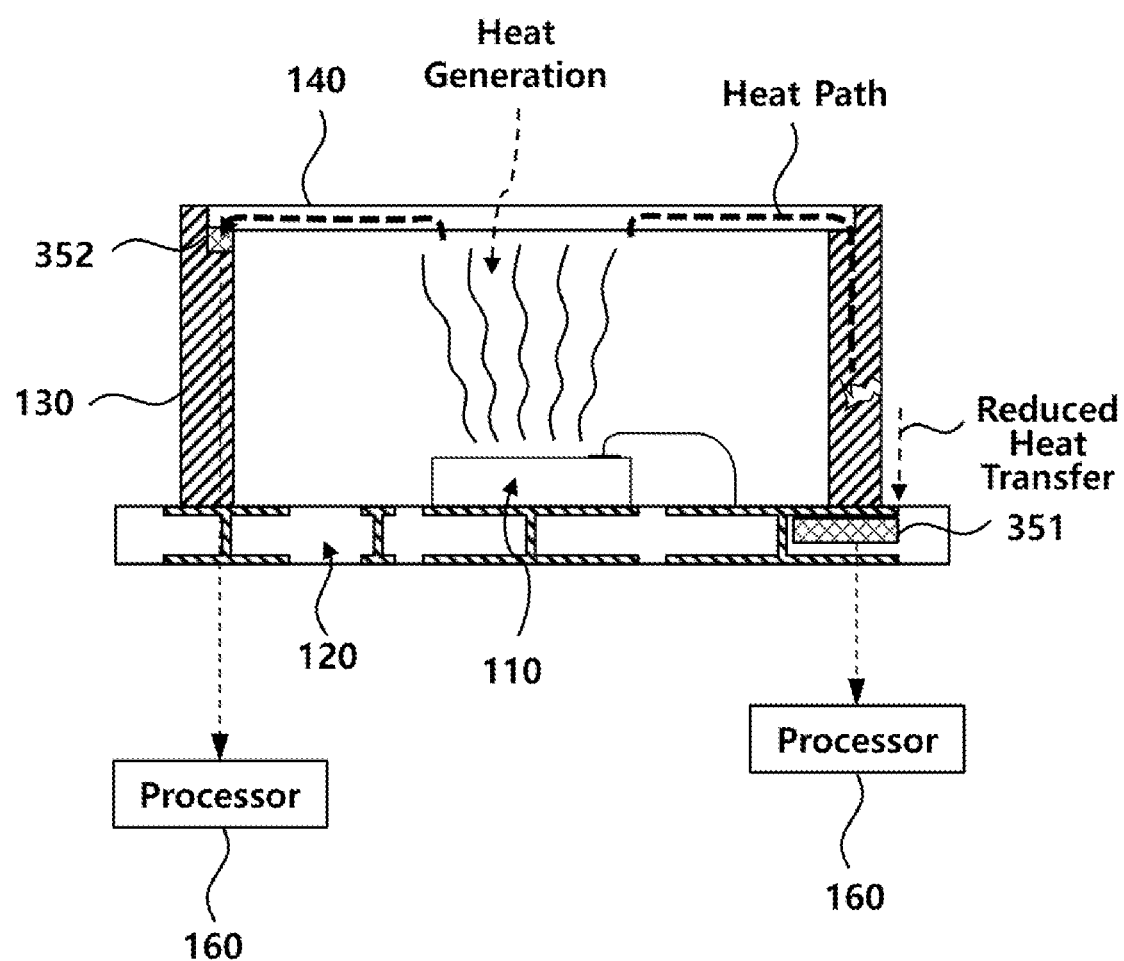
FIG. 9 is a first view illustrating a beam projector module including multiple temperature sensors according to a third embodiment, which is abnormally operating.

FIG. 9 is a first view illustrating a beam projector module including multiple temperature sensors according to a third embodiment, which is abnormally operating.

Figure 10:
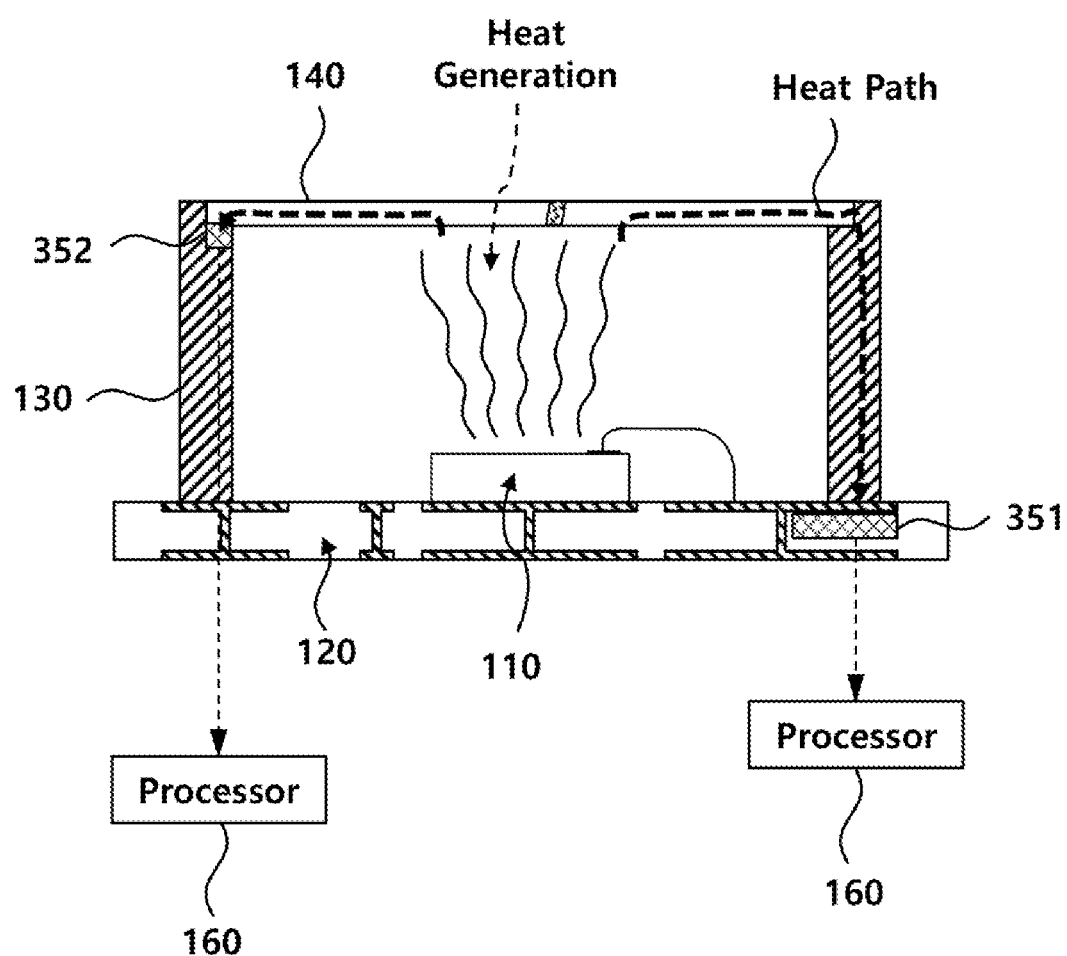
FIG. 10 is a second view illustrating the beam projector module including multiple temperature sensors according to the third embodiment, which is abnormally operating.

FIG. 10 is a second view illustrating the beam projector module including multiple temperature sensors according to the third embodiment, which is abnormally operating.

Referring to FIGS. 9 and 10, the beam projector module may include two or more temperature sensors.

One 351 of the two or more temperature sensors may be connected to the frame 130 to measure the temperature of the frame 130, and another one 352 of the two or more temperature sensors may be connected to the optical device 140 so as to measure the temperature of the optical device 140.

Each of the two or more temperature sensors may be individually connected to the processor 160, may measure the temperatures of the frame 130 and the optical device 140, and may transmit the temperature value to the processor 160.

Referring to FIG. 9, a crack may be generated in the frame 130 for any reason.

When a crack is generated in the frame 130, the amount of heat emitted and transferred from the light source 110 through the frame 130 may be greatly reduced since the path of heat transferred through the frame 130 is reduced due to the generated crack.

Meanwhile, since the heat path to the optical device 140 is maintained even if a crack is generated in the frame 130, the amount of heat emitted from the light source 110 and transferred through the optical device 140 may be smaller than that transferred through the frame 130.

Accordingly, when a crack is generated in the frame 130, the temperature drop rate measured through the temperature sensor 351 connected to the frame may be higher than the temperature drop rate measured through the temperature sensor 352 connected to the optical device.

In addition, the processor 160 compares the temperature drop rates, which are respectively measured by the temperature sensors 351 and 352, and when the temperature drop rate of the frame 130 is higher than the temperature drop rate of the optical device 140, the processor 160 may determine that a crack is generated in the frame 130.

Referring to FIG. 10, a crack may be generated on the optical device 140 for any reason.

When the crack is generated in the optical device 140, since the heat path through the optical device 140 is reduced as opposed to the case in which a frame is generated in the frame 130, the temperature drop rate of the frame 130 may be higher than the temperature drop rate of the optical device 140.

Accordingly, the processor 160 compares the temperature drop rates, which are respectively measured by the temperature sensors 351 and 352, and when the temperature drop rate of the optical device 140 is higher than the temperature drop rate of the frame 130, the processor 160 may determine that a crack is generated on the optical device 140.

Meanwhile, the optical device 140 and the frame 130 may be made of different materials, and may thus be different from each other in thermal conductivity. In addition, the processor 160 may correct the temperature drop rate in consideration of the thermal conductivities of the frame 130 and the optical device 140. Then, the processor 160 may compare the corrected temperature drop rates so as to determine the crack generation position.

Figure 11:
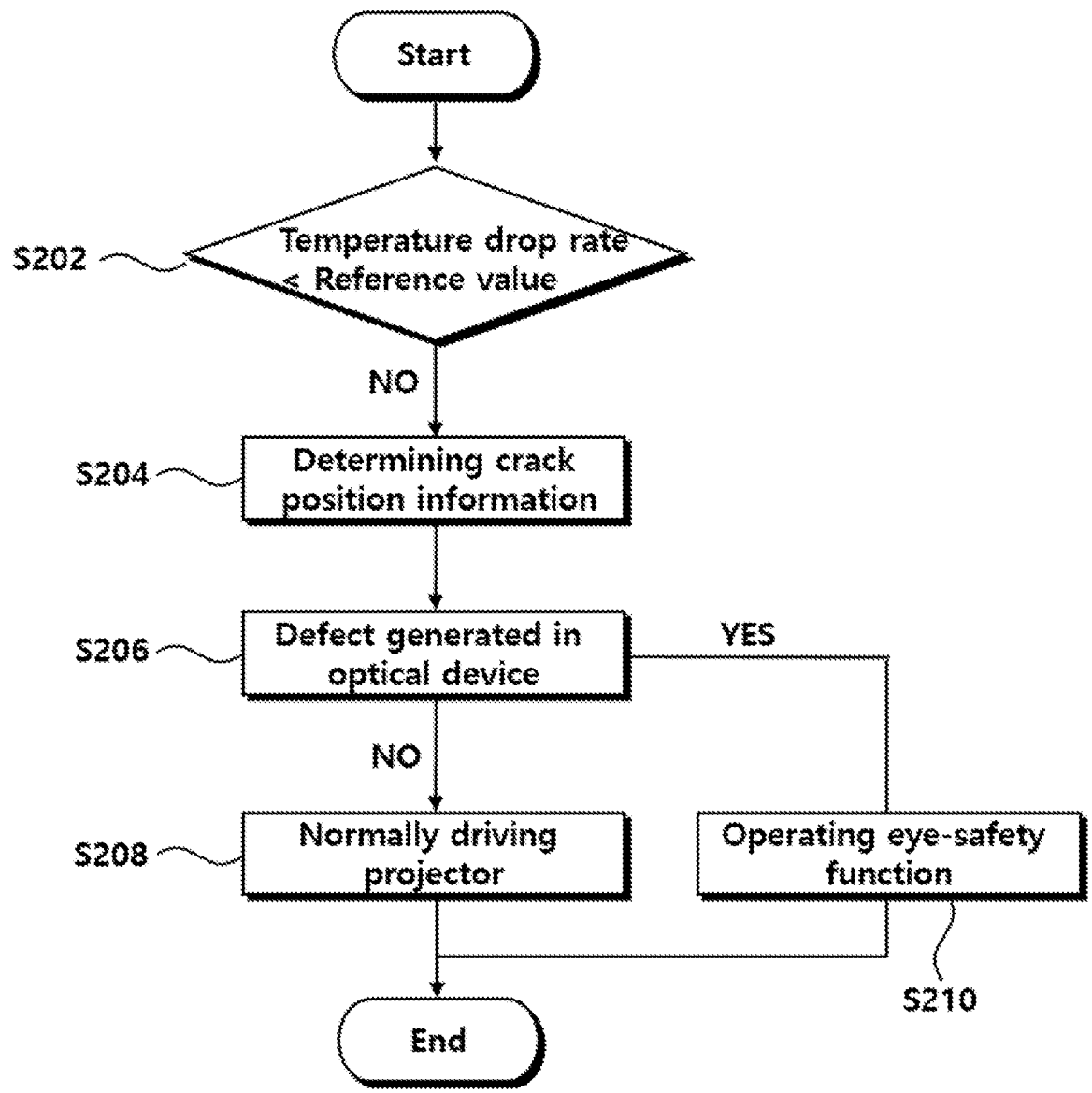
FIG. 11 is a flowchart of a method of operating the eye-safety function of the beam projector module according to the third embodiment.

FIG. 11 is a flowchart of a method of operating the eye-safety function of the beam projector module according to the third embodiment.

Referring to FIGS. 9 to 10 and 11, the temperature sensors 351 and 352 may measure the temperatures of the optical device 140 and the frame 130, and the processor 160 may determine whether or not the temperature drop rate of each of the optical device 140 and the frame 130 exceeds a reference value (S202).

When the temperature drop rate of at least one of the optical device 140 and the frame 130 exceeds the reference value, the processor 160 may compare the temperature drop rates of the optical device 140 and the frame 130 to extract crack position information (S204).

When it is determined that a crack is not generated in the optical device 140 based on the crack position information (NO for S206), the processor 160 may operate the light source 110 in the normal mode (S208).

When it is determined that a crack is generated in the optical device 140 based on the crack position information (YES for S206), the processor 160 may operate the light source 110 in the eye-safety mode (S210).

When it is determined that a crack is generated in the frame 130 or the like that is not greatly related to the safety of the user as the eye-safety mode is activated only when a crack occurs in the optical device 140, the beam projector module 300 may be normally driven. Therefore, it is possible to improve the operation efficiency of the beam projector module 300 by driving the eye-safety mode only when the user's safety is related.

Figure 12:
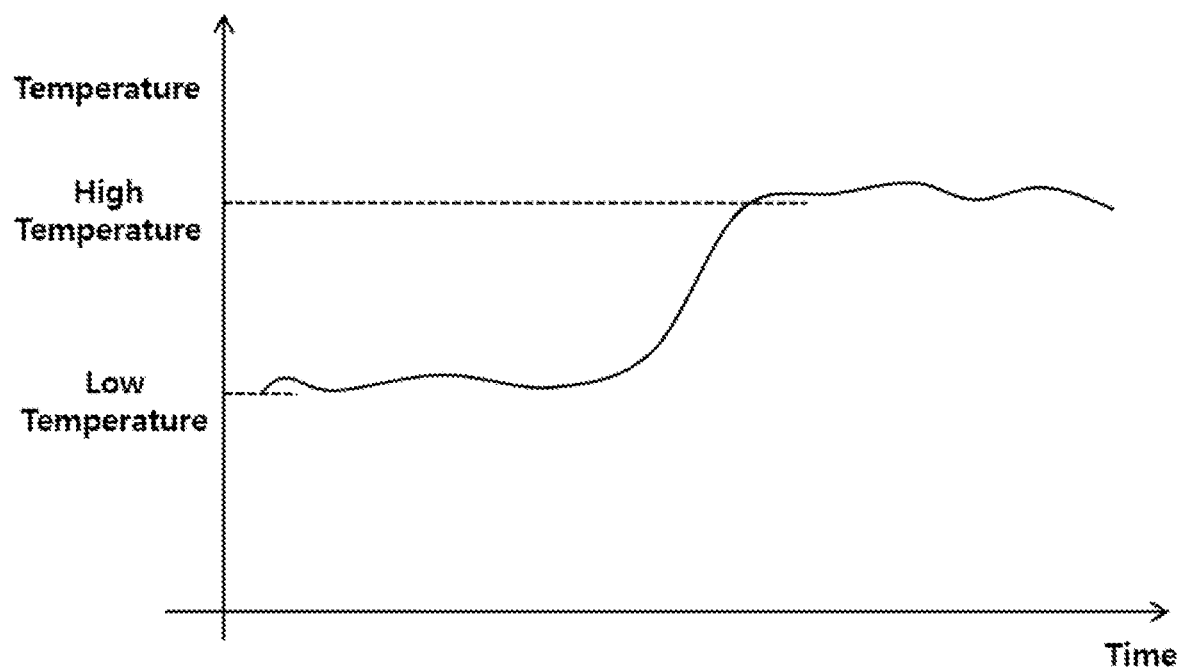
FIG. 12 is an exemplary graph representing a temperature change of a beam projector module.

FIG. 12 is an exemplary graph representing a temperature change of a beam projector module.

Figure 13:
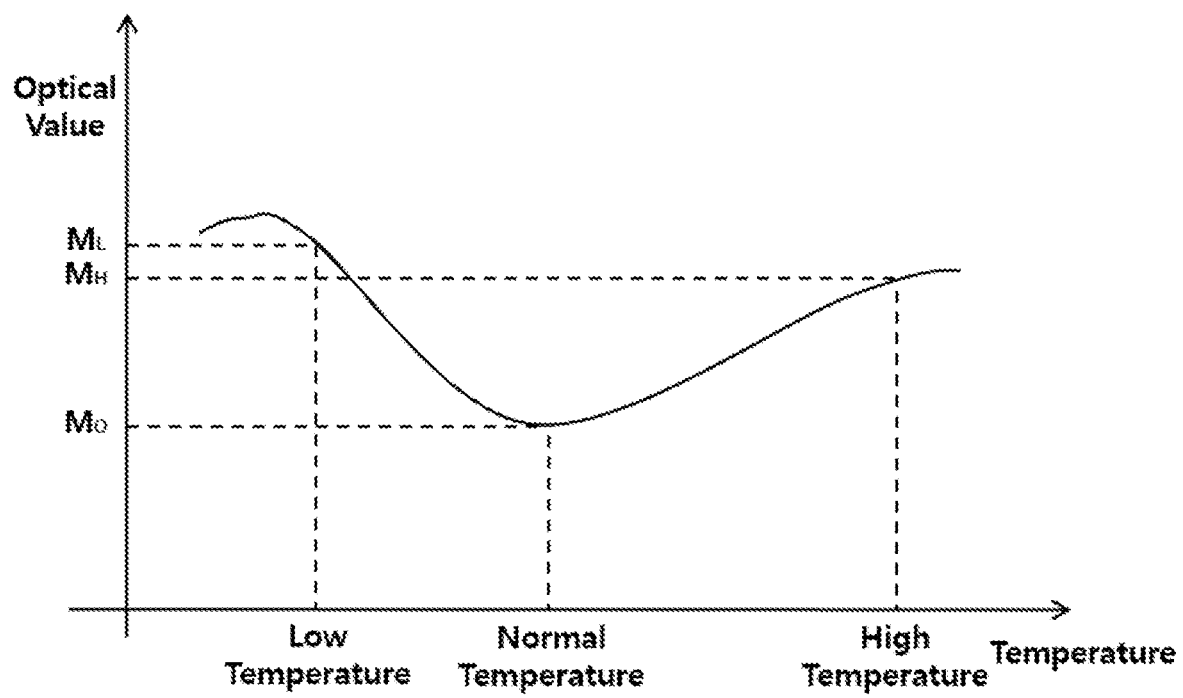
FIG. 13 is an exemplary graph representing an optical value according to a temperature of a beam projector module.

FIG. 13 is an exemplary graph representing an optical value according to a temperature of a beam projector module.

Referring to FIGS. 12 and 13, the temperature of the optical device may be changed due to an external environment or the like. For example, when the user is located in a tropical zone, the optical device may be exposed to a high-temperature environment and the temperature of the optical device may be maintained at a high temperature. As another example, when the user is located in a well-cooled space, the optical device may be kept at a low temperature.

In the case of a beam projector module mounted on a mobile device or the like, the external temperature of the beam projector module varies depending on the environment in which the beam projector module is installed in each mobile device. Accordingly, the temperature of the optical device may vary depending on the installation environment thereof.

The optical value of the optical device may vary depending on the temperature of the optical device. For example, the refractive index of the optical device may vary. As another example, the light transmittance of the optical device may vary. As represented in FIG. 13, depending on the temperature, the optical value of ML may be obtained at a low temperature and the optical value of MH may be obtained at a high temperature.

When the optical value is changed with respect to a light reception device adjusted to be suitable for a predetermined optical value, the reception accuracy of the light reception device may be deteriorated.

In order to solve this problem, in an optical system including the beam projector module and the light reception device, the temperature of the optical device may be confirmed and the optical value may be corrected depending on the temperature of the optical device. Then, the light reception device may sense the light output from the beam projector module depending on the corrected optical value.

Figure 14:
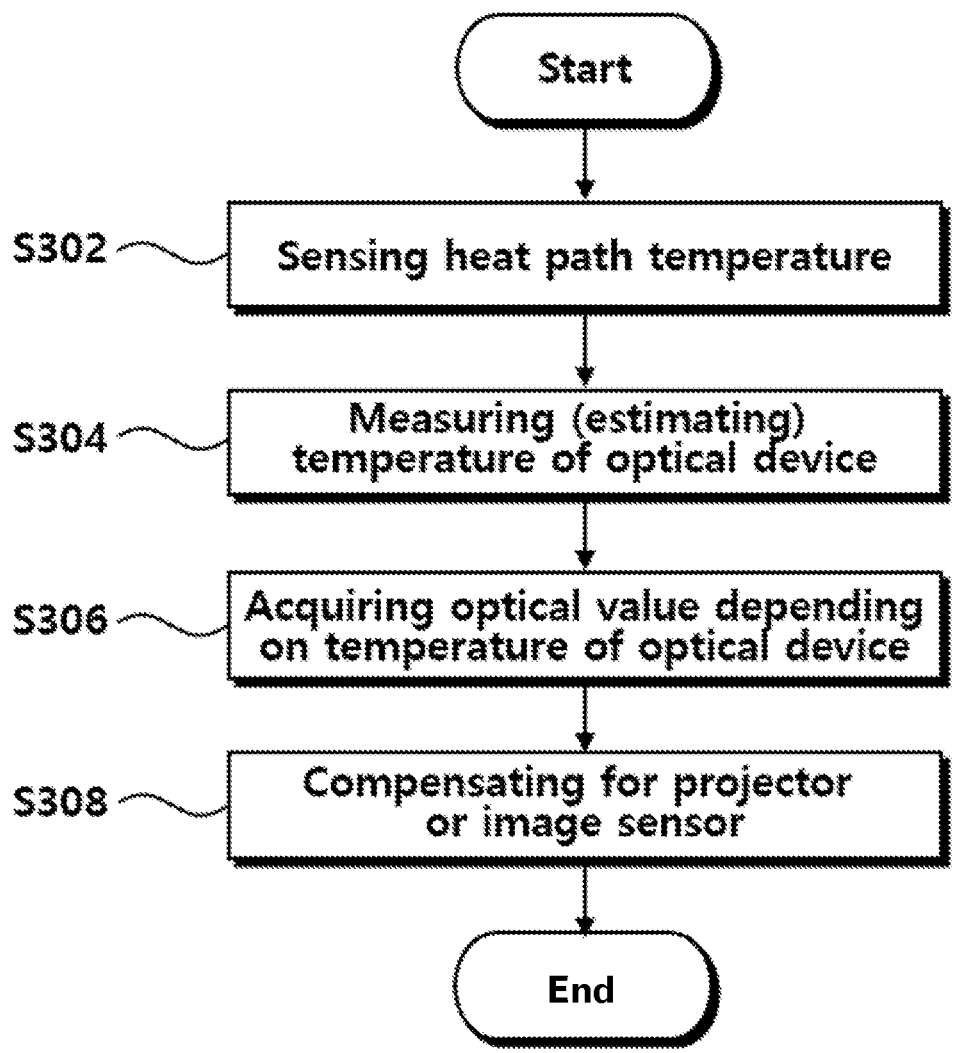
FIG. 14 is a flowchart of a method for compensating for a temperature characteristic of a beam projector module in an optical system according to an embodiment disclosed herein.

FIG. 14 is a flowchart of a method for compensating for a temperature characteristic of a beam projector module in an optical system according to an embodiment disclosed herein.

Referring to FIG. 14, the beam projector module includes a processor, and is capable of measuring the temperatures of the frame and the optical device. The frame may provide a thermal path to support the optical device and to transfer the heat of the optical device to the substrate or the like. The beam projector module may sense the temperature of the thermal path through temperature measurement for the frame (S302).

The beam projector module may use the frame temperature to estimate the temperature of an optical device (e.g., a diffuser) or may directly measure the temperature of the optical device (S304).

Then, the beam projector module may transmit the temperature of the optical device to the light reception device.

The light reception device may obtain the optical value of the optical device using the temperature of the optical device. The light reception device may store information indicating a relation between the temperature and the optical value as represented in FIG. 13 (e.g., a function or a table), and may substitute the temperature of the optical device for this information so as to acquire the optical value of the optical device (S306).

Then, the light reception device may compensate for and a light reception value depending on the optical value (S308).

As described above, according to the embodiments disclosed herein, it is possible to safely protect a user's eyes even if an abnormality occurs in the beam projector module.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A beam projector module comprising:
   a light source configured to output light;
   a substrate configured to support the light source;
   an optical device configured to reduce the light in terms of intensity output to a predetermined space;
   a frame configured to space the optical device apart from the light source by a predetermined distance, the frame forming an inner space with the substrate and the optical device;
   a temperature sensor configured to measure a temperature of the beam projector module; and
   a processor configured to control an output of the light source and operate the light source in an eye-safety mode, based on a measured value of the temperature sensor.

2. The beam projector module of claim 1, wherein the temperature sensor is connected to the frame to measure a temperature of the frame.

3. The beam projector module of claim 1, wherein the temperature sensor is connected to the optical device to measure a temperature of the optical device.

4. The beam projector module of claim 1, wherein the light source comprises a vertical cavity surface-emitting laser (VCSEL), and the optical device comprises a diffuser configured to disperse the light.

5. The beam projector module of claim 1, wherein the processor is configured to transmit temperature data of the beam projector module to a light reception device, and the light reception device is configured to compensate for a temperature characteristic of the light obtained by the optical device using the temperature data.

6. A method of controlling a beam projector module comprising a light source and an optical device configured to reduce intensity of light output from the light source, the method comprising:
   measuring, by a temperature sensor, a temperature of the beam projector module;
   changing, by a processor, the intensity of light output from the light source based on a measured value of the temperature sensor; and
   operating, by the processor, the light source in an eye-safety mode based on the measured value of the temperature sensor.

7. The method of claim 6, wherein the temperature sensor is configured to measure a temperature of the frame that supports the optical device.

8. The method of claim 6, wherein the temperature sensor is configured to measure a temperature of the optical device.

9. The method of claim 6, wherein the temperature sensor is configured to measure a temperature of an inner space surrounded by the frame that supports the optical device.

10. The method of claim 6, wherein the temperature sensor is configured to measure a temperature of the optical device and a temperature of the frame that supports the optical device.

11. The method of claim 6, wherein the reference value is calculated depending on an external temperature measured by an external temperature sensor that communicates with the processor outside the beam projector module.

12. The method of claim 6, further comprising: estimating a temperature of the optical device using a temperature of the frame.

13. The method of claim 12, further comprising:
   transmitting the temperature of the optical device to a light reception device;
   acquiring, by the light reception device, an optical value of the optical device using the temperature of the optical device; and
   compensating, by the light reception device, for a light reception value depending on the optical value.

* * * * *